United States Patent [19]

Chiang

[11] 4,246,533

[45] Jan. 20, 1981

[54] PROXIMITY CONTROLLED POWER SWITCHING CIRCUIT

[76] Inventor: Bing Chiang, 6323 B. Rhode Island Ave., Riverdale, Md. 20840

[21] Appl. No.: 42,475

[22] Filed: May 25, 1979

[51] Int. Cl.$^3$ .................... H03K 17/96; H03K 17/945
[52] U.S. Cl. .................................. 323/349; 307/116; 307/308; 323/904
[58] Field of Search ................ 361/179, 181; 307/116, 307/308; 340/562; 323/19

[56] References Cited

U.S. PATENT DOCUMENTS

| | | | |
|---|---|---|---|
| 2,810,060 | 10/1957 | Green | 240/123 |
| 3,200,304 | 8/1965 | Atkins et al. | 317/146 |
| 3,309,690 | 3/1967 | Moffitt | 340/258 |
| 3,770,981 | 11/1973 | Nelsen | 307/154 |
| 3,811,054 | 5/1974 | Wern et al. | 307/252 H |
| 3,965,465 | 6/1976 | Alexander | 307/125 |
| 4,002,923 | 1/1977 | Larson et al. | 307/116 |
| 4,031,408 | 6/1977 | Holz | 307/116 |
| 4,037,221 | 7/1977 | Alexander | 340/258 C |
| 4,081,700 | 3/1978 | Hamilton | 307/308 |
| 4,159,473 | 6/1979 | Senk | 307/116 |

OTHER PUBLICATIONS

Electronic Engineering, pp. 14, 15, Jul., 1975.

*Primary Examiner*—William H. Beha, Jr.
*Attorney, Agent, or Firm*—Dowell & Dowell

[57] ABSTRACT

A switching circuit controlled by the approach of a body into close proximity to its probe and operative to control the flow of power from an AC source to a load using a silicon control switching device enabled by an oscillator generating narrow gate pulses whenever the oscillator is in turn enabled by a flip-flop, which disables the oscillator in its first stable state and which enables the oscillator in its second stable state. Ambient electrical signals picked up by the probe are shaped into suitable form for triggering the flip-flop from one to the other of said stable states, and the shaping circuitry and the flip-flop comprise CMOS integrated circuits which are used for the purpose of achieving very low current drain and high sensitivity to an increase in ambient signals picked up at the probe, means being provided to adjust threshold sensitivities of the shaping circuit.

10 Claims, 2 Drawing Figures

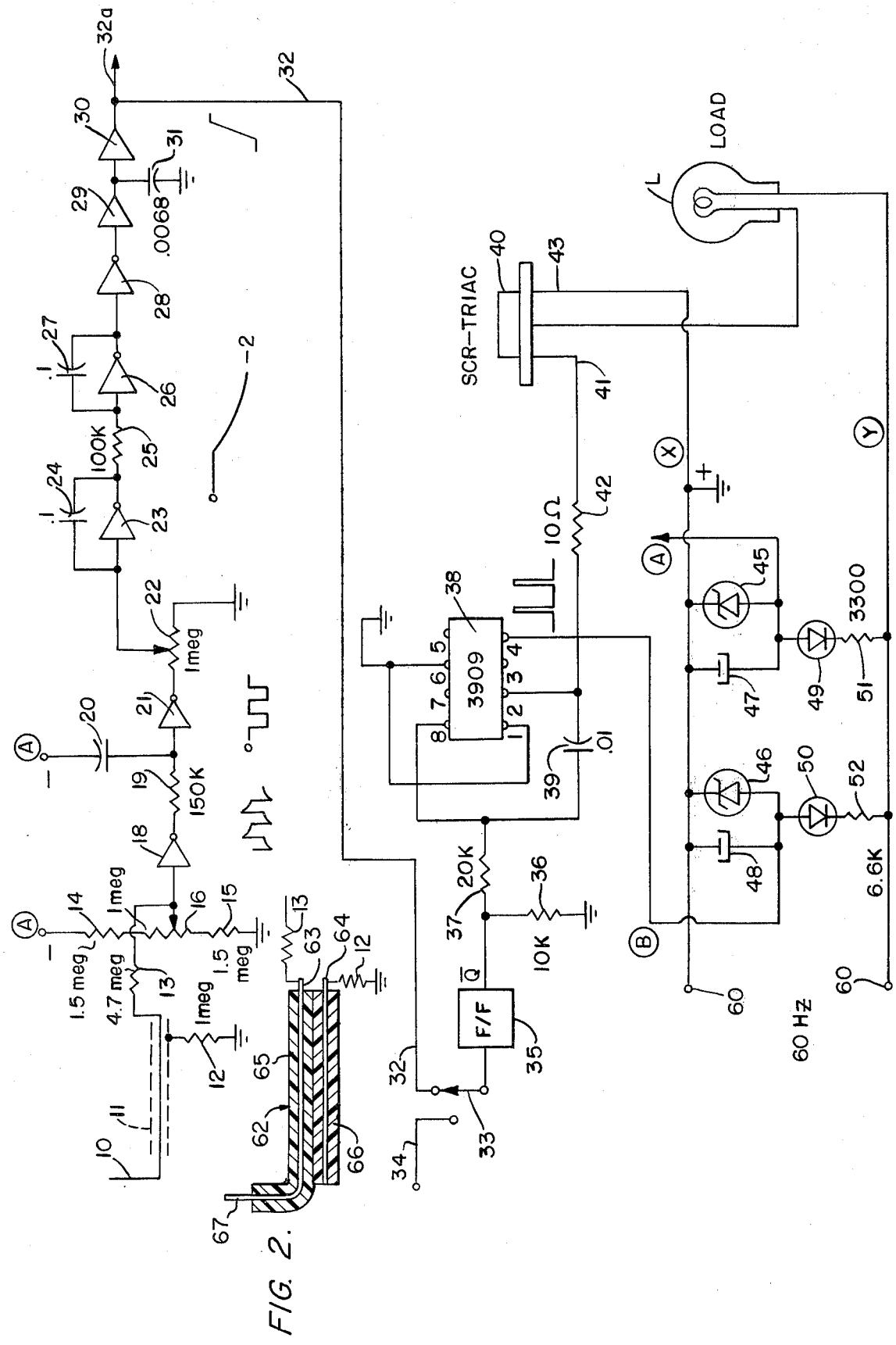

PROXIMITY CONTROLLED POWER SWITCHING CIRCUIT

FIELD OF INVENTION

This invention relates to proximity controlled switching circuits for controlling the flow of power to a load, such flow being turned alternately OFF and ON by the approach of a body to a probe, the word approach also including actual touching of the probe, so that the effect of the approach is to increase the sensitivity of the probe as an antenna, thereby raising the signal level on the probe above the control threshold of the circuitry.

BACKGROUND AND PRIOR ART

There are a great many circuits of the capacitive type which are operated by the approach of a body toward or to an antenna probe to thereby actuate the control circuit from one state to another state. A high degree of sensitivity is easily attained, but most of the prior art circuits suffer from poor stability, thereby tending to render them less than satisfactory as continuously-operating control circuits. Shaping of the input signals is frequently resorted to in order to increase the stability, such shapings taking various forms.

U.S. Pat. No. 3,811,054 to Wern et al shows the broad idea of a probe controlling a triac, which in turn is kept alive by locally generated oscillator pulses. U.S. Pat. No. 4,037,221 to Alexander is of a similar type and shows some degree of shaping of the input signal from the probe including amplifiers and an integrator which integrates a portion of the incoming signals from the touch plate probe.

U.S. Pat. Nos. 3,770,981 to Nelsen; 3,965,465 to Alexander and 4,031,408 to Holz show the idea of adjusting the sensitivity of the incoming signal from the probe, and in the latter patent CMOS circuitry is used. However, the problems involved in using CMOS circuitry as a detector are met in a different way from the present invention, since the type of probe used is quite specialized in the disclosure of the last mentioned patent. It is also noted that the high side of the AC power mains is connected directly to the touch plate in this disclosure, which is viewed as being extremely dangerous practice.

U.S. Pat. Nos. 3,770,981 to Nelsen and 4,002,923 to Larson et al show integrators for shaping an input signal which is later used as a control signal. In U.S. Pat. No. 4,002,923 the system is operated by proximity to a touch plate, but it does not in turn operate a CMOS flip-flop which controls a silicon control switching device. U.S. Pat. No. 4,081,700 to Hamilton also shows the idea of controlling a flip-flop with a touch plate probe.

U.S. Pat. Nos. 3,200,304 to Atkins et al; 3,309,690 to Moffitt and 2,810,066 to Green show proximity controlled circuits wherein an oscillator is caused to oscillate when an approach is made to the probe.

In order to provide truly economical stand-by operation in which the current drawn is extremely small when the device is in the OFF state, it is necessary not only to use CMOS circuitry, but it is also necessary to use it in such a way that it can be biased at or near its most economical current drawing levels, i.e. biasing the individual CMOS chips off from their center voltage levels where they draw the most current. Moreover, it is necessary to protect the CMOS circuitry against excessive voltage inputs which will destroy the CMOS chips. Finally, in order to achieve a circuit which has at the same time a high degree of sensitivity, and a low false alarm rate, it is necessary to provide a highly stable circuit in which a great deal of wave shaping takes place so that upon the approach of a body to the probe the power switching circuit receives a definite control signal free of meaningless spikes and free of unwanted reversals in the rate of change of the control voltage toggling the circuit from one stable state to the other stable state.

THE INVENTION

The present invention comprises a switching circuit for controlling the flow of power from an AC power source to a load in response to an increase in level of signals picked up by the probe as a result of the approach of a body, the word "approach" being herein used to mean both approach as well as in contact with, toward the probe, whereby the picked up ambient noise level in the probe is increased. The electrical noise picked up by the antenna is processed to a considerable extent in order to enhance the 60 Hz AC field component while at the same time suppressing all other noise components. When the signal has been thus enhanced by a time constant circuit resembling a low-pass filter, the signal is then passed through CMOS amplifiers which square the AC component and thereby change it into square pulses which are then carefully shaped and limited in amplitude. These shaped pulses are then integrated in several stages of integration so as to achieve a very smooth rate of integration having no reversals in its characteristic curve. The integrated output level is then used to generate a very steep wavefront which serves to control a CMOS flip-flop from one stable state to the other stable state. Therefore it must be provided with a rapid rise time appropriate for triggering a CMOS flip-flop. In order to achieve this rise characteristic, the integrated DC level is passed through multiple CMOS amplifiers connected in series so that the output from the last amplifier is a rapid rise front occurring whenever the integrated DC level exceeds the critical threshold of the subsequent CMOS amplifier so as to trigger it ON. Digital type amplifiers are used in order to enhance the steepness of the rise characteristic at their output since they are highly non-linear in response to the DC level from the integrators. Since the CMOS flip-flop is sensitive only to the rise, each time an approach occurs at the probe, the rise will occur to reverse the flip-flop, but no further reversal will occur until the body withdraws from the probe and then approaches it again. As a result, each approach to the probe will produce only a single reversal of the flip-flop. Moreover, the time constant of the combined integrators is such as to require the presence of the body near the probe for a significant interval of time before the output of the integrators will reach a sufficient DC level to exceed the threshold of the shaping circuits which changed the DC level from the integrators to a wave form having a steep rise as required to trigger the CMOS flip-flop. When the output of the CMOS flip-flop is high, the oscillator which delivers pulses to the gate of the triac to keep it alive is enabled. These pulses are very narrow, whereby the duty cycle of the oscillator is very low, and its current drain during oscillation is minimized. Separate sources of DC operating voltage are provided, one supplying the oscillator which controls the triac and another separate source supplying the shaping circuits and the flip-flop, whereby the latter supply source is not shocked by the operation of the oscillator which draws a much heavier current than the shaping circuits. This isolation into two separate sources of operating potential provides additional stability to the circuit.

It is the principal object of this invention to provide a proximity sensitive control circuit in which a very high degree of stability is provided while at the same time minimizing the response of the circuit to spurious signals which might otherwise trigger it.

It is another major object of the invention to provide a high degree of shaping of the probe signal which initiates the ON-OFF state of the circuit so that substantially pure digital type signals are produced to accomplish this control, thereby making the circuit compatible with other external digital sources which may be used to operate the flip-flop instead of proximity control operation thereof.

Still another major object of the invention is to provide a circuit in which shaping of probe signals is accomplished using CMOS digital type chips which not only provide thresholds of operation helpful in cleaning up the noisy input signals to the probe, but also provide extremely low current drain during stand-by operation of the switching circuit, whereby it can be economically allowed to operate on a continuous basis since CMOS circuitry draws substantial current only during the brief intervals when it is actually changing state.

It is a further object of the invention to provide shaping circuitry which shapes the AC field components and electrical noise components picked up at the probe into a single sharp rise wave form occurring only once for each approach of a body to the probe, assuming that the approach is of sufficient proximity and duration to exceed the thresholds of the initial shaping circuits and to permit the integrators to integrate a level sufficient to exceed the threshold of the CMOS digital amplifiers which follow the integrating circuits.

Still another object of the invention is to provide a circuit having a high degree of immunity to false triggering, which immunity is achieved by making a circuit which is principally sensitive to AC power line frequencies, and which is sensitive both to the amplitude and duration of such signals caused by an approach, thereby eliminating high level brief duration transients.

Other objects and advantages of the invention will become apparent during the following discussion of the drawings.

THE DRAWINGS

FIG. 1 is a schematic diagram showing a capacitive switching system according to the present invention; and FIG. 2 is a drawing, partially in cross-section of an alternate form of probe using twin-lead wire.

Referring now to the drawing, FIG. 1 shows a circuit which is controlled by a probe 10 which effectively controls the state of a flip-flop 35 which has two stable conditions, one of which turns ON an SCR triac 40, the other stable condition of the flip-flop 35 turning OFF the SCR triac 40. The ON/OFF condition of the triac 40 controls the flow of current through the load L.

As stated in the preceding discussion of the invention, it is a major object of the present invention to use CMOS integrated circuitry so as to enjoy the benefits of its very low current drain during stand-by conditions so that the present capacitive switch system uses small enough amounts of current so that it is economical to allow it to remain operative on a continuous basis. As is well known, CMOS circuitry is of very high sensitivity and can be operated at a relatively low supply voltage, i.e. around 5. It is therefore necessary to convert input signals appearing on the probe 10 to digital form, and to control their magnitudes to such levels as will not damage the sensitive CMOS circuit components.

In order to shape the input signals appearing on the probe 10 so that they will be of proper digital form to control the state of the flip-flop 35, it is necessary to provide a series of shaping circuits as shown across the top of the drawing. The probe 10 is provided with shielding 11, and this shielding is returned to ground through a resistor 12. The probe 10 is connected to a resistive voltage dividing chain through a resistor 13, both the resistors 12 and 13 being of high resistance values in the megohm range. The voltage divider chain is also formed by a series of high resistance resistors 14 and 15, and a potentiometer 16. Suitable values for these resistors are shown on the diagram of the drawing. The resistors 12 and 13 are essentially provided for isolation and safety purposes, whereas the resistance chain connected between power supply voltage and ground is for the purpose of off-setting the DC level of the input signals to the first amplifier 18, which is a CMOS amplifier type CD4049, from a center value where the amplifier would draw too much current.

The output of the amplifier 18 goes through a time constant circuit comprising the resistor 19 and a capacitor 20 whose time constant is such as to remove most of the transients and provide a lowpass characteristic suitable for passing 60 Hz AC components. The amplifier 18 in the presence of a strong 60 Hz input to the probe 10 will provide modified square wave pulses of the type appearing below the amplifier in the diagram. Another similar stage of CMOS amplification is provided by the amplifier 21 which puts out a substantially square wave signal which is symmetrical. The square wave signal is then delivered through a potentiometer 22 to an integrator stage comprising another CMOS amplifier 23 type CD4049 bridged by a capacitor 24 in a manner well known per se. The integrator integrates the square wave pulses appearing at the input of the amplifier 23 and delivers a negative-going integrated DC level which, in the presence of strong 60 Hz components on the probe 10 resembles the wave form shown beneath the amplifiers 23 and 26. This integrated level is coupled by a resistor 25 to a second integrating CMOS amplifier 26 bridged by a capacitor 27. The reason for the second integrator stage 26, 27 is to further smooth the integrating curve so that there are no steps therein, and so that the curve is virtually smooth. This is necessary because the second integrator 26, 27 is followed by three stages of CMOS amplification 28, 29 and 30 which function to provide a steep rise time for the output signal appearing on the wire 32 which drives the flip-flop 35. The flip-flop is a CMOS CD4027 dual flip-flop, of which only one unit is used. The $\overline{Q}$ output of the flip-flop 35 is either in the zero state or the one state at any particular time, and each of the output pulses on the wire 32 reverses the state of the $\overline{Q}$ output.

When the $\overline{Q}$ output is high, it puts a high signal across the coupling network comprising the resistors 36 and 37, and this high signal enables the integrated oscillator circuit 38 which comprises a type LM3909 flasher oscillator component. This oscillator 38 including the capacitor 39 delivers a series of high, narrow output pulses to the SCR triac 40, i.e. to the gate terminal 41 thereof through a current limiting resistor 42. The capacitor 39 taken together with the internal circuitry of the flasher oscillator 38 provides a series of very narrow pulses occurring at a repetition rate of about 1000 Hz, and these pulses keep the triac alive substantially continuously while the flip-flop 35 is enabling the oscillator 38.

The input terminal 43 of the triac is connected to a source of 60 Hz power taken from one terminal 60, whereas the other side of the load L is connected to the other 60 Hz terminal 60. These two terminals 60 can be connected directly to the municipal power system. The 60 Hz appears across the wires X and Y, and suitable rectifier-regulator means are connected thereacross as shown near the bottom of the drawing. These comprise respectively a source of current A for the CMOS circuitry and a separate source B for the oscillator 38 and triac 40. The source A includes a Zener diode 45 regulating to a −5 volt level at the terminal A, and the source B includes a Zener diode 46 regulating to a level of −7 volts at the terminal B. Capacitors 47 and 48 serve to smooth the supplied DC voltages, and half-wave rectification from the hot wire Y to the diodes 45 and 46 is provided by rectifiers 49 and 50 which are connected in series with dropping resistors 51 and 52 in a manner well known per se. The wire X should be thought of as ground reference level for purposes of the circuitry shown in the diagram above the power supply.

The voltage dropping resistors 51 and 52 provide a degree of safety, not only because they tend to isolate the AC hot line Y from the rest of the circuitry, but because in case of a failure, the resistors 51 and 52 would burn out and thereby fail "open". The Zener diodes 45 and 46, on the other hand, would fail as short circuits, thereby protecting the integrated circuits. As an additional safety measure, a suitable isolation transformer (not shown) may be interposed between the terminals 60 and the 60 Hz power source.

FIG. 2 shows an alternate form of probe differing from the coaxial cable probe 10 and 11 shown in FIG. 1. The alternate form of probe comprises a length 62 of twin-lead wire, for instance such as lamp cord or such as the type of wire used for connecting loudspeakers to an amplifier in a hi-fi installation. The conductor 63 is integral with the probe wire 67 and is connected to resistor 13, also seen in FIG. 1. The conductor 64 is the shield and is grounded through the resistor 12, also seen in FIG. 1. The twin-lead 62 has two plastic jackets 65 and 66 which are united along a common edge in a manner well known per se. The shield conductor is thus maintained in close proximity to the probe conductor 63 and sufficiently shields it against excessive pick up of stray fields, but a length 67 of the conductor 63 extends beyond the shield 64 and serves as the probe to detect the approach of a body. The portion 67 can be left bare so that it can be actually touched, or it can remain covered with insulation, at least part-way along its length, to add greater shock protection for persons using the circuit.

OPERATION

The operation of the present system is such as to control the flow of power from an AC power source comprising the wires X and Y to a load L, which is illustrated in the drawings as being a light bulb. The triac 40 controls the flow of power under the control of its input gate 41 which requires a positive going signal at least once every half cycle to turn the triac back on after a zero crossing. In this instance, a much larger number of pulses is provided by the oscillator 38 which supplies a large number of very narrow pulses, each of duration approximating a few microseconds, and the number of pulses being very much larger than the number of cycles per second of the power supply. In the case of the manufactured product, the repetition rate of the pulses on wire 41 is about 1000 Hz. The oscillation of the oscillator 38 is disabled by the flip-flop 35 when in its first state in which the output at the $\overline{Q}$ terminal is low, or is enabled when the flip-flop is in its second state at which the output is high. The input to the flip-flop 35 through the switch 33 must be several volts in amplitude to be sufficient to trigger the flip-flop to its other stable state. The control signal to the flip-flop 35 must also have a rapid rise time no greater than about 15 microseconds in order to properly trigger the flip-flop. A less rapid rise time will result in the rejection of the control signal by the flip-flop 35 which is designed not to respond to slow rise time signals to prevent false triggering by induced noises.

Moreover, because of its fast rise-time output, the output at 32a of the amplifier 30 can be directly interfaced with other digital equipment, such as a computer. The switch 33 is, for purposes of the present circuit, connected to the wire 32, but it is moveable to connect to the wire 34 in the event that some other digital external equipment is to be used to trigger the state of the flip-flop 35.

The probe 10 serves as an antenna which picks up ambient electrical fields in the vicinity of the probe and delivers a signal to the voltage divider 16 which signal includes various spurious noise components plus 60 Hz field components picked up in the vicinity. When a person approaches the probe, and/or actually touches it, his body serves as an extension of the probe 10 which enlarges its capabilities as an antenna, thereby greatly increasing the signal level at the probe. The probe is connected by a shielded wire to the voltage divider 16 and the shield is connected to ground through a resistor 12. The resistors 12 and 13 serve to make the probe safer to touch, since they make the impedance between it and the power supply very high. The shield may pass all the way around the probe wire, or alternatively it may simply be one of two wires in a twin lead, such for instance as lamp cord as shown in FIG. 2, wherein the other conductor is exposed somewhat beyond the first conductor 11, the portion extending beyond the shield conductor 11 serving as the probe 10. Considerable shielding is achieved by the shield wire 11 even in twin-lead configuration where the shield 11 does not extend all the way around the probe wire 10. Another advantage of twin-lead is that both the probe wire and the shield wire are insulated to provide greater protection against shock to persons approaching the probe.

The power supply in the present circuit has its positive side grounded, and the voltage divider 14, 15, 16 extends between ground and the negative hot terminal A. The potentiometer 16 is adjusted such that the DC bias level on the signal from the voltage divider to the first amplifier 18 is just below the threshold level required to trigger that amplifier. The amplifier 18, as well as the amplifiers 21, 23, 28, 29 and 30 are all digital type amplifiers, each having a threshold which must be exceeded in order to provide output.

The amplifiers 18 and 21 comprise part of a time constant circuit which is coupled to receive signals from the probe by way of the resistive network 13, 14, 15 and 16 and to deliver an output which is dominated by the AC components of the 60 Hz field in the vicinity.

The time constant is provided by the resistor 19 and the capacitor 20 which form a lowpass filter tending to eliminate input transients to a great extent. The amplifier 21 is easily saturated by the output of the amplifier 18, and since transients have been essentially filtered out, the output of amplifier 21 comprises negative square pulses as shown on the drawing beneath that amplifier.

The potentiometer 22 adjusts the level of the output from the amplifier 21 so that when a body is brought into proximity with the probe 10, the output from the amplifier 21 will easily exceed the threshold input level of the integrator 23 and cause it to begin accumulating energy from the square wave pulses, building an increasing negative DC potential, which is applied through the resistor 25 to a second integrator comprising the amplifier 26 and capacitor 27. These two series-connected integrators comprise the integrator means of the circuit which together produces a very smooth integration curve having no bumps in it, and also having an accurately controlled integration rate. A single integrator was found to provide a less than smoothly accumulating voltage level, and rough spots in the integration curve tended to trigger the flip-flop 35 more than once during what should have been a single integration step.

Since the output of the amplifier 26 is a slowly changing smooth curve as shown beneath that amplifier, and since a steep rise pulse is necessary to properly trigger the flip-flop 35, the three CMOS amplifiers 28, 29 and 30 have been connected in cascade to steepen the rise characteristic of the control pulse appearing on wire 32 and represented by the wave form beneath these three amplifiers. The capacitor serves the purpose of taking out any very narrow transients which might otherwise appear in the circuit. The amplifiers 29 and 30 are type CD4050.

The three amplifiers 28, 29 and 30, comprise a second amplifier means which are also of the digital CMOS type and each of which has a threshold, which when exceeded results in a steep rise at the output voltage. Three such amplifiers coupled in series provide an extremely rapidly rising front taking less than 15 microseconds, which front triggers the flip-flop 35 very effectively.

It is a characteristic of a CMOS circuit that it draws a miniscule amount of current, except for the brief instant when both complementary transistors are ON while it is actually switching from one state to another. Therefore, since the various amplifiers, flip-flops, etc. which are used in the present circuit are of the CMOS type, the circuit draws almost no current except while it is being used to switch the load either ON or OFF. As a result, the circuit can be left connected and operative continuously 24 hours a day without putting a noticeable burden upon household consumption of energy during its stand-by intervals, whether ON or OFF. The present switching circuit is characterized by its very high degree of stability, its small current drain, and by its insensitivity to transient signals which occur accidentally from time to time because of natural causes, most of which transients are too brief in time to actuate the circuit, especially because of the degree of integration necessary to achieve a level through the amplifier 26 sufficient to trigger the next amplifier 28.

The present invention is not to be limited to the exact form shown in the drawings, for obviously changes may be made therein within the scope of the following claims.

I claim:

1. A low current-drain switching circuit for controlling the flow of power from an AC power supply to a load in response to an increased level of pick-up of signals, including electrical noise and ambient AC field components, at a probe as a result of the approach of a body to the probe, the circuit comprising:
   a silicon control switching device coupling the load to the power supply and having a control gate;
   oscillator means operative when enabled to deliver pulses to said control gate to render the silicon control switching device conductive, the pulses occurring at a repetition rate higher than the frequency of the AC power supply;
   a CMOS flip-flop having an output having a first and a second stable state, the output being connected to enable said oscillator means in said second state and to disable the oscillator means in said first state;
   time constant means coupled to receive signals from said probe and to deliver output dominated by said AC components;
   first CMOS amplifier means connected to receive said output and having an input threshold, said first amplifier means delivering square wave pulses of predetermined amplitude and corresponding to the frequency of said AC components when said components are present at a level exceeding said threshold;
   integrator means coupled to receive said square wave pulses when present and operative to integrate them to provide a gradually accumulating DC voltage level; and
   second CMOS amplifier means connected to receive said accumulating DC level and operative to produce a fast rising control signal when the DC level has sufficiently accumulated, the control signal being connected to the CMOS flip-flop to toggle it from one stable state to the other.

2. The switching circuit as claimed in claim 1, further including a high resistance network coupling the probe to the time constant means, the network being adjustable so that in the absence of a body in close proximity to said probe the level of ambient components picked up can be adjusted to be below said threshold.

3. The switching circuit as claimed in claim 1, wherein said first and said second CMOS amplifier means respectively comprise multiple digital amplifiers connected in series and each being of the type having a fixed level output for input signals exceeding a given critical level.

4. The switching circuit as claimed in claim 3, further including adjustable potentiometer means connecting the integrator means to said first CMOS amplifier means and adjusted to set the level of the square wave output from the first amplifier means to provide a DC level from the integrator means below said critical level when there is no body in close proximity to the probe.

5. The switching circuit as claimed in claim 1, wherein said integrator means includes plural series-connected integrator circuits.

6. The switching circuit as claimed in claim 1, wherein the probe is coupled to said time constant means through a lead including a resistance in the megohm range, and said lead having a shield associated therewith, and the shield being grounded through a resistance in the megohm range.

7. The switching circuit as claimed in claim 1, wherein said probe comprises a metal conductor coupled with said time constant means and having a covering of insulating material surrounding the probe.

8. The switching circuit as claimed in claim 1, wherein said probe comprises twin lead wire having a covering of insulating material, one conductor of the twin lead being coupled with said time constant means and the other conductor being returned to ground, the free end of said one conductor extending beyond the free end of the other conductor to form a signal sensing probe.

9. The switching circuit as claimed in claim 1, wherein said AC power supply comprises rectifier and regulator means connected to an AC power line through isolation resistors whose wattage capacity is selected so that the resistors fail "open" when excessive power is drawn from the supply.

10. The switching circuit as claimed in claim 9, wherein said regulator means comprise Zener diodes which upon failure comprise short circuits.

* * * * *